US008698660B2

(12) United States Patent
Mallinson et al.

(10) Patent No.: US 8,698,660 B2
(45) Date of Patent: Apr. 15, 2014

(54) FEEDBACK IN NOISE SHAPING CONTROL LOOP

(71) Applicant: ESS Technology, Inc., Fremont, CA (US)

(72) Inventors: A. Martin Mallinson, Kelowna (CA); Dustin Dale Forman, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 13/665,801

(22) Filed: Oct. 31, 2012

(65) Prior Publication Data

US 2013/0106486 A1    May 2, 2013

Related U.S. Application Data

(60) Provisional application No. 61/554,363, filed on Nov. 1, 2011.

(51) Int. Cl.
    *H03M 3/00*     (2006.01)
(52) U.S. Cl.
    CPC .................................... *H03M 3/458* (2013.01)
    USPC .......................................... 341/143; 341/155

(58) Field of Classification Search
    CPC ....................................................... H03M 3/458
    USPC .......................................... 341/120, 143, 155
    See application file for complete search history.

(56) References Cited

U.S. PATENT DOCUMENTS

| 4,704,600 | A  | * | 11/1987 | Uchimura et al. | 341/122 |
| 6,839,012 | B2 | * | 1/2005  | Kawamura        | 341/143 |
| 7,619,550 | B2 | * | 11/2009 | Maeda et al.    | 341/143 |
| 7,916,054 | B2 | * | 3/2011  | Baker           | 341/143 |
| 8,120,518 | B2 | * | 2/2012  | Jang et al.     | 341/143 |

* cited by examiner

*Primary Examiner* — Brian Young
(74) *Attorney, Agent, or Firm* — Gard & Kaslow LLP (57) ABSTRACT

The present application describes an apparatus and method for improving the performance of ΣΔ modulators functioning as ADCs. In one embodiment, the ΣΔ modulator comprises a plurality of quantizers operating in a round-robin fashion, rather than the single quantizer of the prior art. The use of multiple quantizers allows the ΣΔ modulator to appear to be functioning at a significantly higher rate than a single quantizer allows. In another embodiment, a second-order ΣΔ modulator contains a plurality of control loops, rather than the single control loop of the prior art. The use of multiple control loops allows the ΣΔ modulator to have multiple points of maximum signal-to-noise ratio rather than a single such point as in prior art ΣΔ modulators.

12 Claims, 7 Drawing Sheets

FEEDBACK IN NOISE SHAPING CONTROL LOOP

This application claims priority from Provisional Application No. 61/554,363, filed Nov. 1, 2011, which is incorporated by reference in its entirety.

FIELD OF THE INVENTION

The present invention relates generally to noise shaping control loops, and more particularly to feedback in such control loops.

BACKGROUND OF THE INVENTION

Noise shaping control loops are well known in type of analog to digital converters (ADCs) known as sigma-delta ($\Sigma\Delta$) converters. Such converters are also sometimes called $\Sigma\Delta$ modulators, the modulator term referring to an output digital data stream having a certain symbol pattern, or modulation, imposed upon it by the control loop. The terms $\Sigma\Delta$ modulator and noise shaping control loop are often used interchangeably in the art, although the latter is more descriptive. Circuit designers often like to use such $\Sigma\Delta$ modulators as in many cases they may be simpler to design and cheaper to make than other types of ADCs.

In such a noise shaping control loop, a continuous analog signal is applied at the input, and a digital pattern representative of this signal emerges from the output. The digital signal is created by one or more quantization elements in the control loop, for example, by non-linear elements in the loop such as flip-flops or comparators that have a discrete set of non-continuous output values for any given continuous input quantity.

The "noise shaping" of the control loop relates the loop's ability to manage the deviation from the ideal continuous feedback that the quantization elements necessarily introduce. This deviation from the ideal continuous feedback represents a source of noise in the loop, and it is this noise that is "shaped." To "shape" the noise means to filter it, generally to make it not appear in certain frequency bands. The loop therefore operates to suppress this noise in certain frequency bands of interest, often at the expense of increased noise in bands that are not relevant to the application.

The band in which the quantization noise is suppressed is determined by the filter in the control loop, i.e., by the frequency dependence of the elements within the control loop. Such a filter design commonly results in the noise being suppressed at low frequencies, for example, in the zero to 20 KHz band as may be required for an audio device. Less common, but of increasing interest in the industry, are so called "band-pass $\Sigma\Delta$ modulators" that have a loop designed to suppress the quantization noise in a specified band. For example, in TV applications it is very desirable to have low noise in the band from 41 MHz to 47 MHz, but not necessary to have low noise at lower (or higher) frequencies. Thus, modulators that have such characteristics are known as "band-pass" modulators since the frequency range of interest is a relatively small band.

Figure 1:
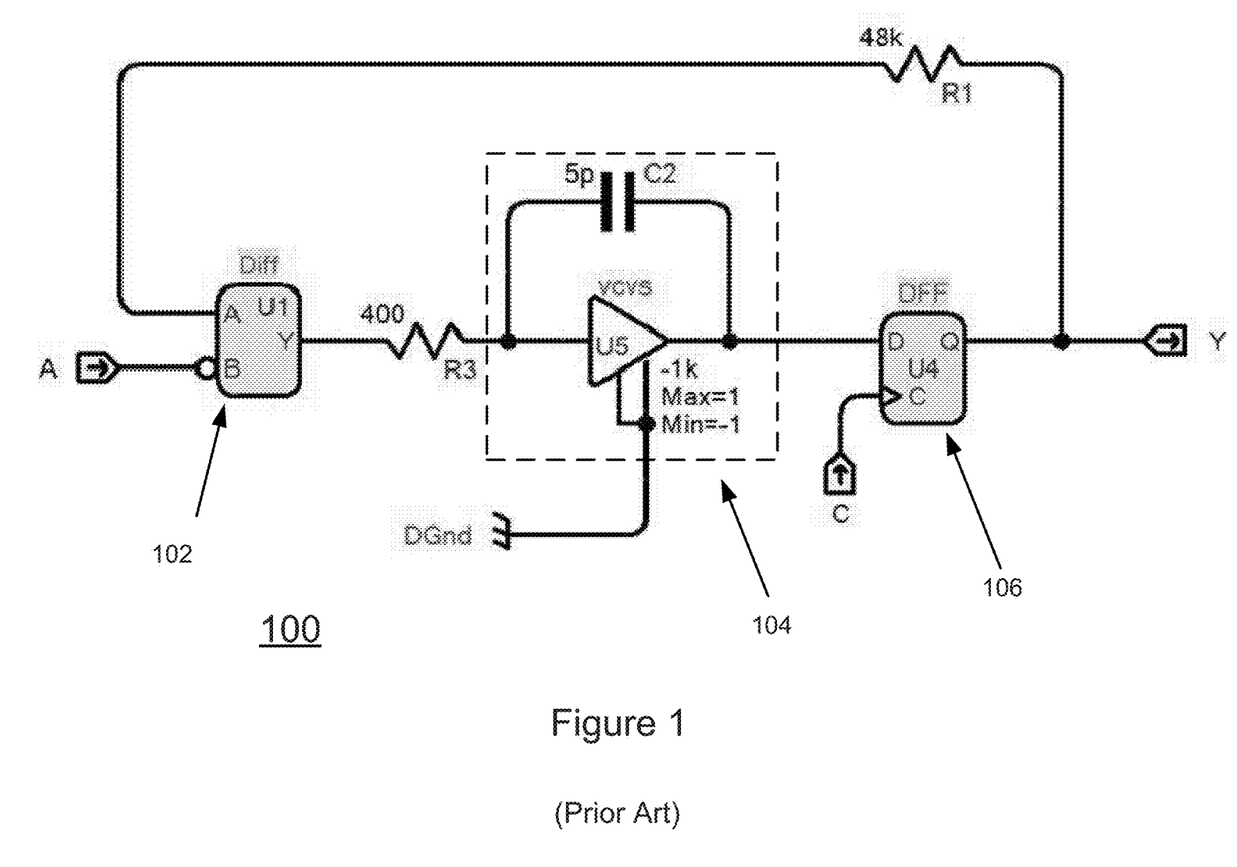
FIG. 1 is a block diagram of a $\Sigma\Delta$ modulator with a first-order control loop functioning as a simple ADC as is known in the prior art.

FIG. 1 shows a $\Sigma\Delta$ convertor functioning as a simple ADC 100 as is known in the prior art. An input signal is applied to a comparator, or differential circuit, 102, where it is compared to another value, which is the fed-back output of ADC 100. The output of the comparator 102, which is thus the difference between the input and the output of ADC 100, i.e., the "error" in the quantization, is fed to an integrator circuit 104 where it is integrated over time. The result of such integration is fed to a quantizer 106.

Quantizer 106 is clocked by a clock C, and thus will output a value, i.e., "quantize" the input, on each clock pulse. If the clock C is at 1 megahertz (MHz), an output value will be produced every 1 microsecond ($\mu$S). If the input to quantizer 106 is greater than 0, the output of quantizer 106 is a value of 1, while if the input to quantizer 106 is less than 0, the output of quantizer 106 is a value of $-1$. The string of 1 and $-1$ values is the output of the ADC 100, and is also fed back through a resistor R1 as the other input to comparator 102, to be compared to the input signal.

It is the limitation of the output of the quantizer 106 to only the two values 1 and $-1$ that is the source of noise in the control loop, as these values will most often be very inexact estimates of the analog input, which may have any value between 1 to $-1$. For example, a sine wave, which varies continuously between 1 and $-1$, will be represented solely by a string of values of 1 and $-1$ in the circuit 100 of FIG. 1.

One of skill in the art will appreciate that an output representing a better estimate of the input would result if the quantizer were able to select from a greater number of values, so that output values closer to the input values from 1 to $-1$ could be obtained. A set of output values of 1, 0 and $-1$ would provide an improvement, while a set of output values of 1, 0.5, 0, $-0.5$ and $-1$ would provide still further improvement, etc. Thus, designing the quantizer such that a larger set of output possibilities are available increases the mathematical number of information "bits" in the quantizer and reduces the noise in the ADC.

It will also be appreciated that another way of improving the output of such an ADC is to increase the rate at which the input signal is sampled. This requires increasing the speed of operation of the quantizer, and thus the clock speed. However, as will be discussed further below, both increasing the set of output values of the quantizer and increasing its clock speed present other problems that reduce the advantages that $\Sigma\Delta$ modulators may have over other ADCs.

In addition, as will be explained further below, a $\Sigma\Delta$ modulator in which additional integrators and feedback are included (a "second-order" control loop) allows for a maximum signal-to-noise ratio (SNR) at a particular frequency. In some applications, it would be desirable to have multiple such frequencies of low noise.

For these reasons, a simple and inexpensive way of improving the performance of $\Sigma\Delta$ modulators functioning as ADCs may be useful.

SUMMARY OF THE INVENTION

The present application describes an apparatus and method for improving the performance of $\Sigma\Delta$ modulators functioning as ADCs.

In one embodiment is an apparatus, comprising: a comparator configured to receive an input signal and a feedback signal, and to generate an error signal that is the difference between the input signal and the feedback signal; an integrator for receiving and integrating the error signal; a clock for generating a plurality of clock signals of a single frequency, each clock signal out of phase with the next by a pre-determined interval; a plurality of quantizers, each quantizer configured to receive the integrated error signal and to generate a quantizer output upon receipt of a different one of the clock signals, such that successive quantizers receive clock signals in time-delayed succession at pre-determined intervals, and each quantizer is configured to operate at a rate of the interval between clock signals times the number of quantizers; a summer for receiving and summing the plurality of quantizer outputs; and a feedback loop for receiving the summed quantizer outputs and providing them as the feedback signal to the comparator.

In another embodiment is an apparatus, comprising: a comparator configured to receive an input signal and a feedback signal, and to generate an error signal that is the difference between the input signal and the feedback signal; a first integrator for receiving and integrating the error signal; a second integrator for receiving and further integrating the integrated error signal from the first integrator; a clock for generating a plurality of clock signals of a single frequency, each clock signal out of phase with the next by a pre-determined interval; a plurality of quantizers, each quantizer configured to receive the further integrated error signal from the second integrator and to generate a quantizer output upon receipt of a different one of the clock signals, such that successive quantizers receive clock signals in time-delayed succession at pre-determined intervals, and each quantizer is configured to operate at a rate of the interval between clock signals times the number of quantizers; a summer for receiving and summing the plurality of quantizer outputs; a feedback loop for receiving the summed quantizer outputs and providing them as the feedback signal to the comparator; a third integrator for receiving and further integrating the integrated error signal from the second integrator; and a resonator feedback loop for receiving the further integrated error signal from the third integrator and providing it as an input signal to the second integrator.

In still another embodiment is an apparatus, comprising: a comparator configured to receive an input signal and a feedback signal, and to generate an error signal that is the difference between the input signal and the feedback signal; a first integrator for receiving and integrating the error signal; a second integrator for receiving and further integrating the integrated error signal from the first integrator; a first quantizer configured to receive the further integrated error signal from the second integrator and to generate a first quantizer output upon receipt of a clock signal; a third integrator for receiving and further integrating the integrated error signal from the second integrator; a first resonator feedback loop for receiving the further integrated error signal from the third integrator and providing it as an input signal to the second integrator; a third integrator for further integrating the integrated error signal from the first integrator; a second quantizer configured to receive the further integrated error signal from the third integrator and to generate a second quantizer output upon receipt of a clock signal; a fourth integrator for receiving and further integrating the integrated error signal from the third integrator; a second resonator feedback loop for receiving the further integrated error signal from the fourth integrator and providing it as an input signal to the third integrator; a clock for generating a clock signal to the first and second quantizers; a summer for receiving and summing the outputs of the first and second quantizers; and a feedback loop for receiving the summed quantizer outputs and providing the sum as the feedback signal to the comparator.

In yet another embodiment is an apparatus, comprising: a comparator configured to receive an input signal and a feedback signal, and to generate an error signal that is the difference between the input signal and the feedback signal; a signal processing block having a defined frequency response for receiving and processing the error signal; a clock for generating a plurality of clock signals of a single frequency, each clock signal out of phase with the next by a pre-determined interval; a plurality of quantizers, each quantizer configured to receive the processed error signal and to generate a quantizer output upon receipt of a different one of the clock signals, such that successive quantizers receive clock signals in time-delayed succession at pre-determined intervals, and each quantizer is configured to operate at a rate of the interval between clock signals times the number of quantizers; a summer for receiving and summing the plurality of quantizer outputs; and a feedback loop for receiving the summed quantizer outputs and providing them as the feedback signal to the comparator.

DETAILED DESCRIPTION OF THE INVENTION

The present application describes an apparatus and method for improving the performance of $\Sigma\Delta$ modulators functioning as ADCs. In one embodiment, the $\Sigma\Delta$ modulator comprises a plurality of quantizers operating in a round-robin fashion, rather than the single quantizer of the prior art. The use of multiple quantizers allows the $\Sigma\Delta$ modulator to appear to be functioning at a significantly higher rate than a single quantizer allows.

In another embodiment, a second-order $\Sigma\Delta$ modulator contains a plurality of control loops, rather than the single control loop of the prior art. The use of multiple control loops allows the $\Sigma\Delta$ modulator to have multiple points of maximum signal-to-noise ratio rather than a single such point as in prior art $\Sigma\Delta$ modulators.

Referring again to FIG. 1, it may be seen that the quantizer 106 not only quantizes the output signal, and thus the feedback signal, in amplitude (here with one bit of resolution, since the output is either 1 or −1), but also in time, since the quantizer 106 operates at a certain rate determined by the clock pulses and holds the output fixed between each pair of clock pulses.

As stated above, there are two ways to improve the performance of a $\Sigma\Delta$ modulator functioning as an ADC. One way is to increase the speed at which the quantizer operates, as this will reduce the effect of the noise, i.e., the deviation of the quantizer output from the ideal continuous value. However, as will be discussed further below, this has certain issues and limitations.

A second way of improving the performance of such a circuit is to increase the number of possible output values of the ADC so that the output may more closely track the input. As noted above, even increasing the possible output values from the set of 1 and −1 to the set of 1, 0 and −1 will result in an improvement in the output.

In the known art such generation of three output levels (or any number greater than two) would require that the integrator output be compared to multiple distinct levels. For example, generating −1, 0 and 1 may be achieved by the quantizer outputting a signal of 1 volt if the integrator output exceeds ⅓ of a volt, outputting −1 volt if the integrator output is below −⅓ of a volt, and outputting a 0 in all other instances.

By contrast, as described herein, multi-level feedback may be achieved with quantizers that always compare to a single level (i.e., zero) but the quantizers do not all move in lock-step one with the other; rather, they are clocked so that their changes of state are separated in time such that they may exhibit different states of +1 or −1, each contributing a weight (often, but not necessarily, equal) to the feedback. Thus, the feedback may have multiple states, and the elements connected to the multiple outputs (resistors in this example) operate to present to comparator 102 an equivalent multi-level feedback signal.

Figure 2:
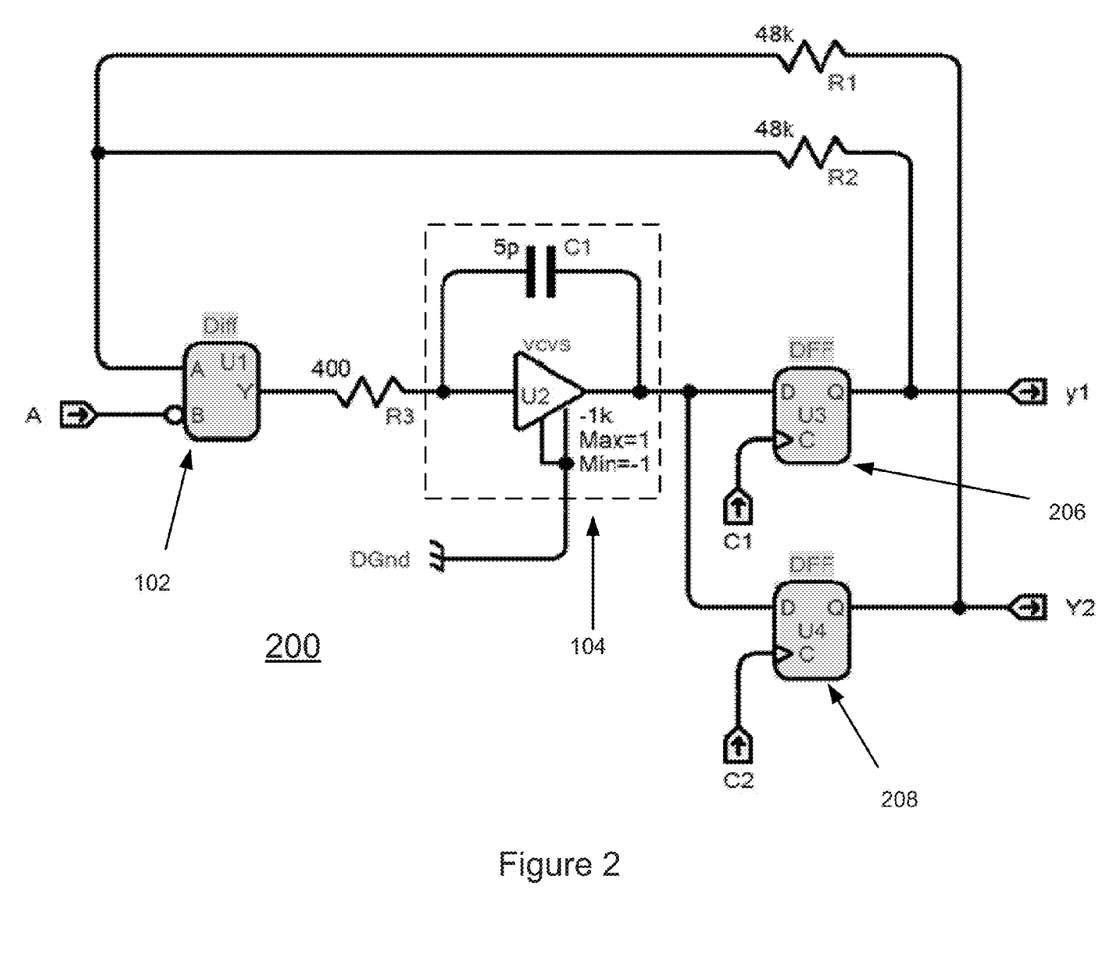
FIG. 2 is a block diagram of a $\Sigma\Delta$ modulator in which a pair of quantizers operates in an alternating fashion according to one embodiment.

Such a simple circuit 200 for adding 0 as a possible output is shown in FIG. 2. An input signal is again applied to comparator 102, where it is compared to the fed-back output of ADC 200. The output of comparator 102, which is again the difference between the input and the output of ADC 200, is again fed to integrator circuit 104 where it is integrated over time. Now, however, the result of such integration is fed to two quantizers 206 and 208, which are clocked by clocks C1 and C2 respectively.

In the embodiment shown, quantizers 206 and 208 operate alternately in a "ping-pong" fashion, such that one quantizer will produce an output and, after a particular interval, the other quantizer will produce an output, and then the first quantizer will produce another output after another interval of the same length. Thus, in one embodiment, each quantizer 206 and 208 may operate at half the speed of quantizer 106 of circuit 100 in FIG. 1 while collectively quantizing the integrated error at the same rate as quantizer 106.

Clocks C1 and C2 thus also each operate at half the speed of the clock C of FIG. 1; thus, where clock C was, for example, a 1 MHz clock, clocks C1 and C2 may each be a clock of 500 kilohertz (KHz), with clock pulses every 2 μS rather than every 1 μS as in FIG. 1. To achieve the "ping-pong" effect of alternating the quantizer outputs, clocks C1 and C2 are offset by half a clock cycle, so that each clock generates a clock pulse halfway between two clock pulses of the other clock. The net effect is that one clock or the other generates a pulse every 1 μS, and one quantizer or the other quantizes the error signal every 1 μS, as in FIG. 1, but the quantizers 206 and 208 operate more slowly than quantizer 106.

As with quantizer 106 in FIG. 1, the output of quantizer 206 is a 1 or a −1. Similarly, the output of quantizer 208 is also a 1 or a −1. The output of circuit 200 is the sum of the outputs of the quantizers 206 and 208. Thus, when each quantizer produces an output of 1, the output of circuit 200 is 2, and when each quantizer produces an output of −1, the output is −2. (The amplitude of the output signal may be adjusted if necessary.) Now, however, there is a third possible output value; when one quantizer produces an output of 1 and the other quantizer produces an output of −1, the total output of circuit 200 is 0.

As with the output of quantizer 106 in FIG. 1, the outputs of both quantizers 206 and 208 are fed back to comparator 102 through resistors R1 and R2, so that comparator 102 receives the average of the two outputs Y1 and Y2. Thus, comparator 102 will receive a value of 1 if each quantizer is presently producing a 1 output. One of skill in the art will appreciate various ways in which resistors may be selected to accomplish this.

It may thus be seen that when each quantizer produces an output of 1 (and each thus contributes a 0.5 as an input to comparator 102), comparator 102 receives a value of 1 to compare to the input signal. When each quantizer produces an output of −1, comparator 102 receives a value of −1 to compare to the input signal. However, when one quantizer 206 or 208 produces an output of 1 and the other quantizer produces an output of −1, comparator 102 receives a value of 0 to compare to the input signal.

Depending upon the input signal, the availability of a third output value, and thus a third value for the feedback input to comparator 102, will in general result in a smaller error signal being output from comparator 102 and input to the integrator 104. This will further increase the accuracy with which the output of quantizers 206 and 208 track the input signal. Thus, circuit 200 will have an improved response to the input signal over the circuit 100 if FIG. 1.

As above, in one embodiment quantizers 206 and 208 may operate at half the speed of quantizer 106. In another embodiment, each quantizer 206 and 208 may operate at the same 1 MHz rate as quantizer 106, with each clock C1 and C2 thus also operating at 1 MHz but offset from each other by 0.5 μS. Now the effect of circuit 200 is that of a circuit operating with double the feedback rate of circuit 100, although each quantizer 206 and 208 still operates at the same speed as quantizer 106. To achieve such a result with the circuit of FIG. 1 would require a clock C and quantizer 106 operating at 2 MHz, rather than 1 MHz.

It will thus be appreciated that further improvement will be seen if there are more than 3 possible output values, or if a circuit can operate at a still greater effective rate. Thus, where FIG. 2 illustrates two quantizers operating in a "ping-pong" fashion, more quantizers operating in a "round-robin" fashion one after another will increase the effective feedback rate still further.

Some prior art circuits have attempted to accomplish a similar result by using ADCs and DACs (digital-to-analog converters, the reverse of ADCs) within the ΣΔ modulator. For example, in FIG. 1, quantizer 106, which has two output values, 1 and −1, might be replaced by a 4-bit ADC which thus provides 16 levels of output. This 4-bit signal is the output of the ΣΔ modulator which is to be fed back to comparator 102. To do so, it must be converted back to an analog signal, which means that a 4-bit DAC must replace resistor R1 in the feedback loop.

While the use of such a DAC and ADC will improve the performance of the ΣΔ modulator significantly, it also significantly adds to the cost of the ΣΔ modulator, thus somewhat defeating the cost advantage that the ΣΔ modulator has over other types of ADCs. Further, the ADC must run significantly faster than the input signal to be digitized. For example, for an input signal of 1 MHz, it is preferable to have the ADC run at a speed at least 10 times faster, i.e., 10 MHz (this is known as the "over-sampling-ratio" or OSR). In practice, it is rare to see an OSR less than 20, while 32 is a common choice; in some cases, an OSR of even 100 is used, so that an ADC sampling a 1 MHz signal would need to run at 100 MHz.

By contrast, the circuit of FIG. 2 uses only two quantizers (for example, flip-flops, which are very cheap) and resistors to accomplish its desired result. To increase the number of possible output levels will of course require still more quantizers and resistors. However, adding more flip-flops and resistors to get the same number of possible output levels and obtain a similar result to the solution which includes a DAC and ADC is expected to involve less cost, given the relative cost of resistors and, for example, flip-flops, as compared to a DAC and an ADC.

Figure 3:
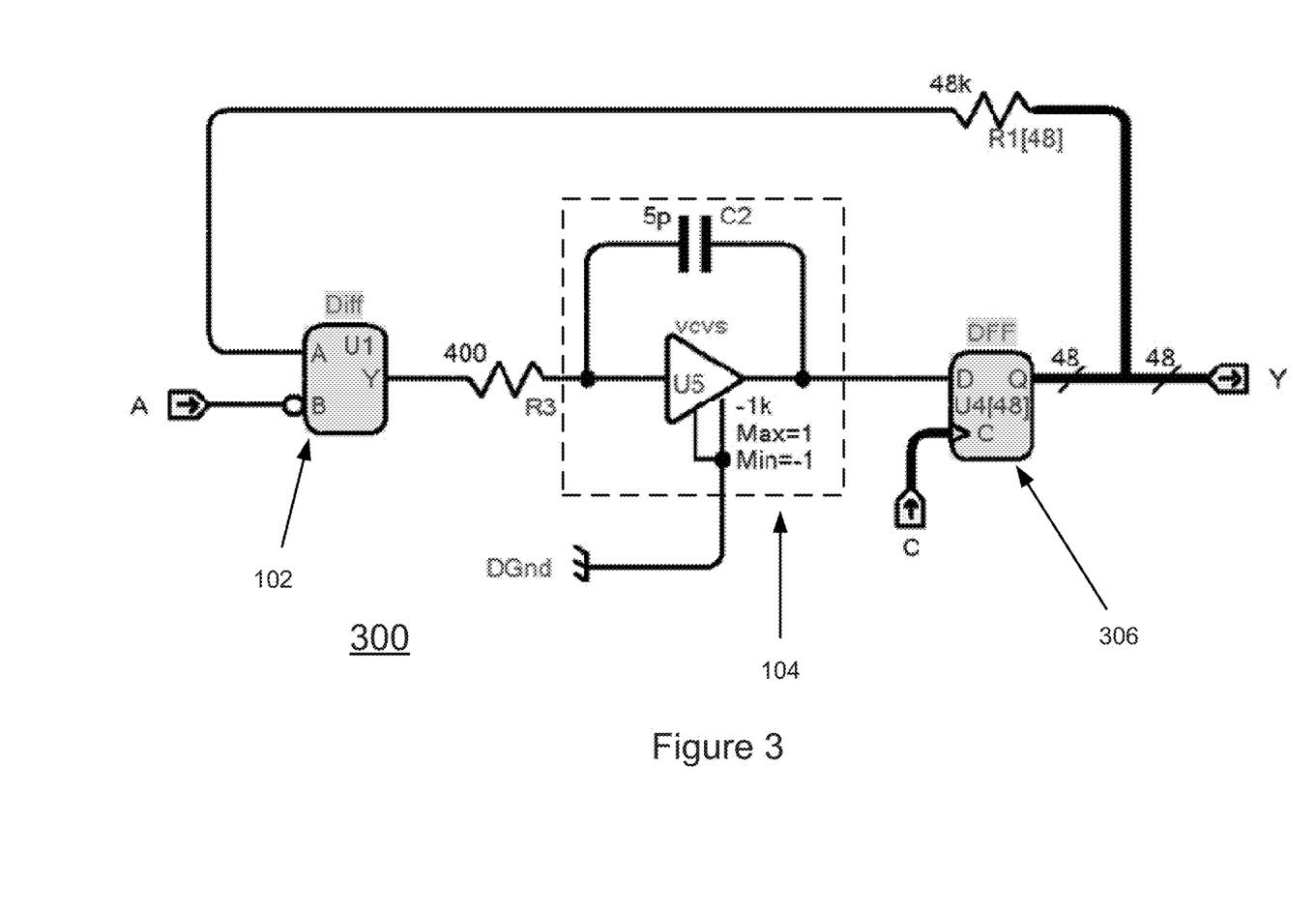
FIG. 3 is a block diagram of a $\Sigma\Delta$ modulator with a first-order control loop according to one embodiment.

FIG. 3 shows a block diagram of one such embodiment in which a circuit 300 contains 48 quantizers 306 (as indicated by "[48]" in quantizer 306) operating in such a round-robin fashion. The 48 outputs from quantizers 306 are averaged to produce the output of circuit 300, as well as being fed back through 48 resistors R1 and averaged to create the feedback signal to comparator 102. Again, comparator 102 compares the feedback signal to the input signal, and feed the resulting error signal to an integrator 104. The output from the integrator 104 is quantized by each of the 48 quantizers in turn.

As with circuit 200 of FIG. 2, it is possible to achieve the feedback rate of circuit 100 of FIG. 1 by using a significantly slower clock and quantizers 306. To achieve a feedback rate of 1 MHz, each quantizer need only run at slightly over 20 KHz. Alternatively, if each quantizer is run at 1 MHz (as quantizer 106 in FIG. 1) and separated from the next quantizer by just over 20 nanoseconds (nS), circuit 300 will have a feedback rate of about 48 MHz.

The numbers used here are for illustration only. In a more practical application, a clock of about 200 MHz may be used and applied in 48 different phases, each phase differing by 100 picoseconds (pS) from the next. In such a case, each quantizer and feedback look operates at only 200 MHz, but the overall circuit appears to have a feedback rate of about 10 gigahertz (GHz).

Thus, the cost of designing and implementing components that will run at significantly greater speeds is replaced by the problem of providing a number of clock phases offset at 100 pS intervals. A technique for easily creating such offset clocks is described in U.S. patent application Ser. No. 13/414,487, commonly owned by the assignee of the present application. Other techniques for creating such offset clocks are known in the art, such as phase locked loops.

Figure 4:
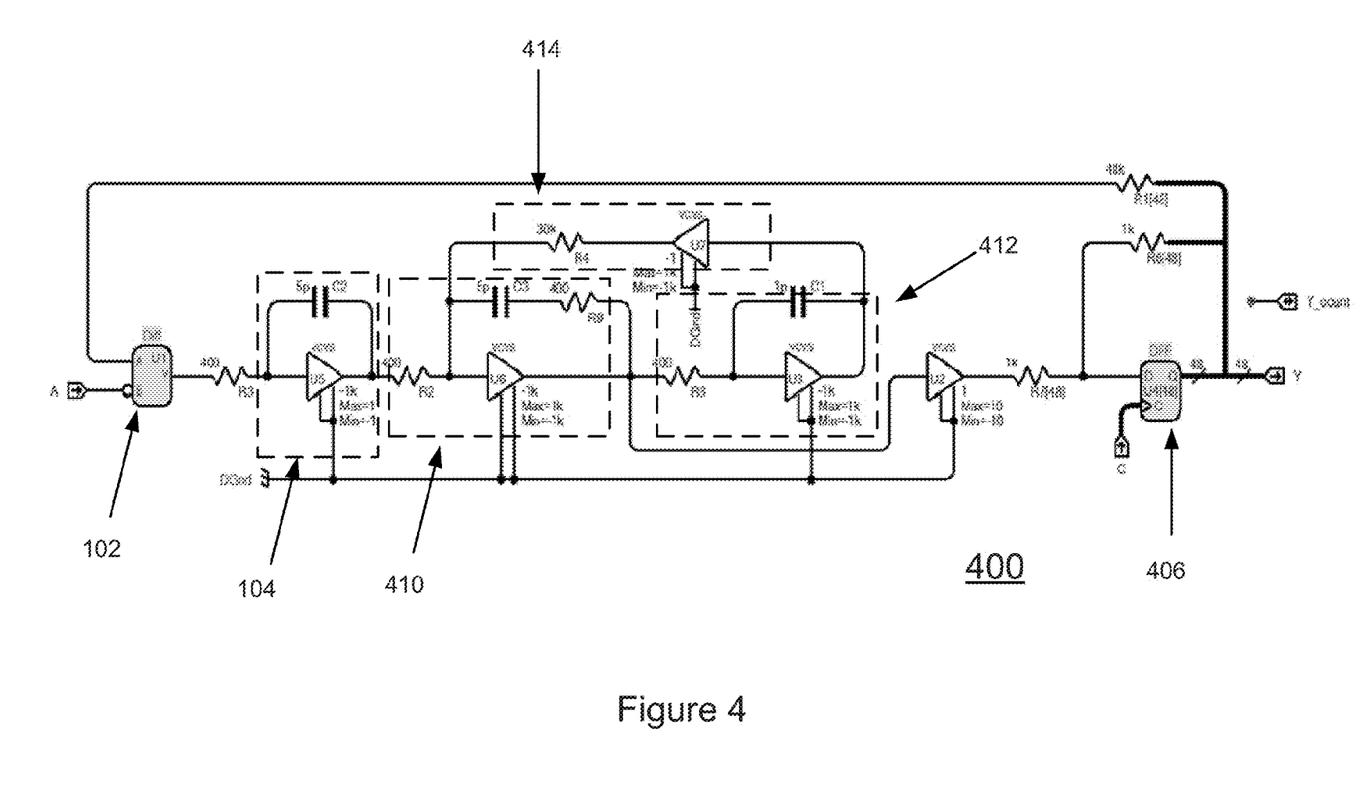
FIG. 4 is a block diagram of a $\Sigma\Delta$ modulator with a second-order control loop according to one embodiment.

The circuits 100, 200 and 300 of FIGS. 1, 2 and 3 respectively are "first-order" control loops, i.e., there is a single integrator in each one. In practical applications, higher order loops having more integrators are known. FIG. 4 shows an embodiment of a second-order control loop 400 in which 48 quantizers are used in a fashion similar to circuit 300 of FIG. 3.

As in the previous circuits, a comparator 102 compares the input signal to a fed-back output signal. Similarly, a first integrator 104 integrates the error signal from comparator 102. However, a second integrator 410 then integrates the output of the first integrator 104.

The output of the second integrator 410 is fed to the quantizers 406, which quantize the received signals in a round-robin fashion as described with respect to FIG. 3, each quantizer receiving a clock signal of a phase different from the other quantizers. Also as in FIG. 3, the sum of the 48 outputs of quantizers 406 is the output of the circuit 400. The 48 quantizer outputs are fed to 48 resistors R1, and then summed, and the sum is again fed back to comparator 102 for comparison with the input signal. In some embodiments, the outputs of the first integrator 104 and second integrator 410 may be scaled by a factor and summed to help stabilize the loop.

It should be noted that in FIG. 4 there are also 48 resistors R7 before quantizers 406, one resistor leading to each quantizer. There are also 48 resistors R6 which form a path from the inputs to the outputs of each of the quantizers 406. These resistors R6 and R7 help to separate noise from the quantizers 406 and may thus be desirable in one embodiment.

Circuit 400 also contains a third integrator 412; however, third integrator 412 does not provide a signal to the quantizers 406. Rather, third integrator 412 drives a resonator feedback loop 414. As is known in the art, the combination of second integrator 410, third integrator 412 and resonator feedback loop 414 forms an oscillator with a gain Q that is not high enough to actually oscillate but provides high gain at a particular frequency so that the noise at that frequency may be pushed down close to zero. By adjusting the resistor values, it is possible to select the range in which noise will be minimized. This is the "noise shaping" that is referred to as a characteristic of the ΣΔ modulator.

Figure 5:
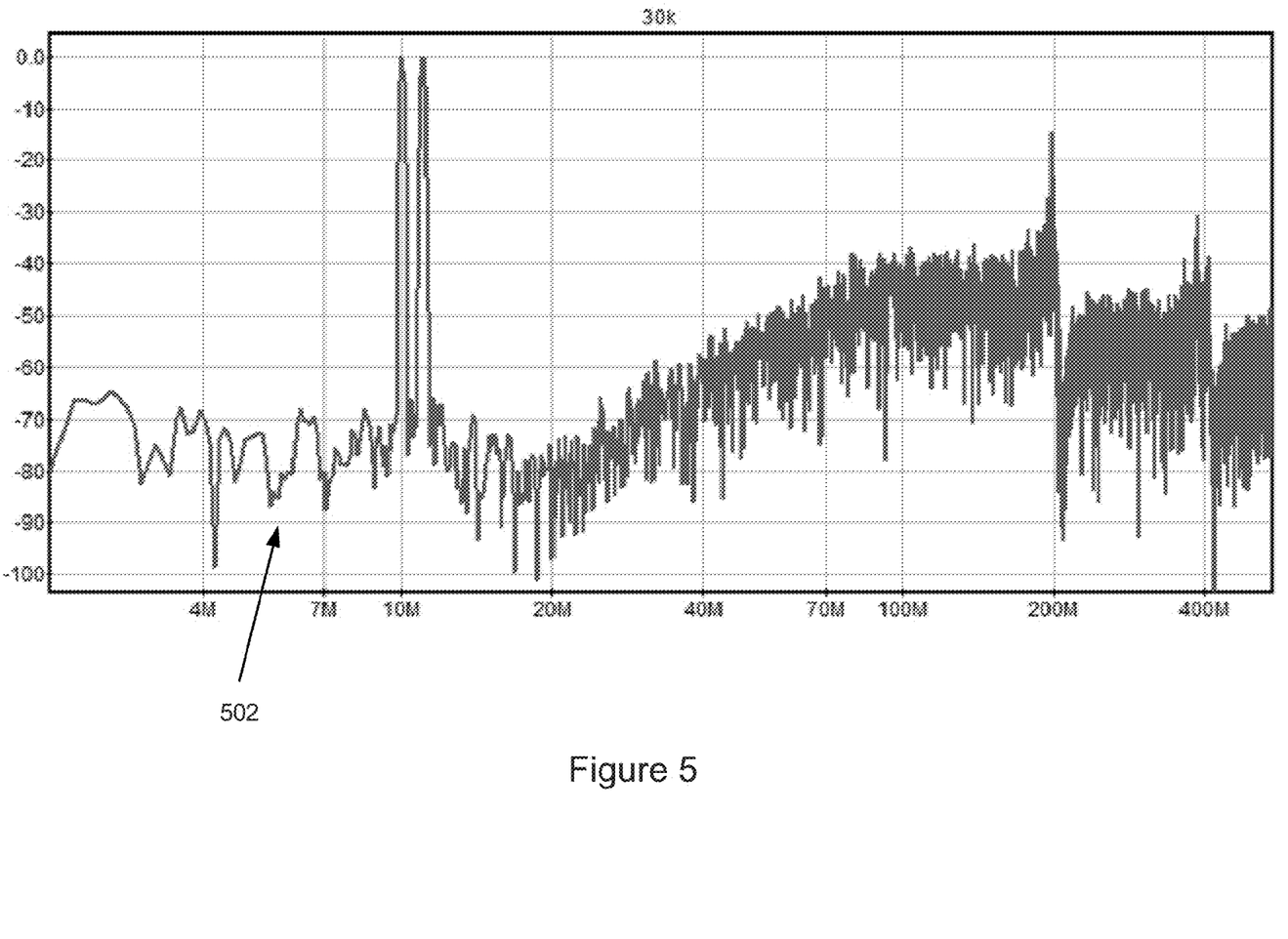
FIG. 5 is a graph showing the signal-to-noise ratio across a frequency range which results from one embodiment of the circuit of FIG. 4.

An example of this is shown in FIG. 5, which shows a curve 502 of the signal-to-noise ratio (SNR) of the output from a circuit 400 of FIG. 4. As above, a clock of about 200 MHz is applied to quantizers 406 in 48 distinct phases, each differing by 100 pS from the next. Noise is at a minimum of about −80 dB compared to the input signal at a frequency of about 18 to 20 MHz, as determined by the resonant feedback elements around the second integrator 410 and third integrator 412.

This is a substantial improvement over a conventional ΣΔ modulator. A clock operating at 200 MHz will oversample an input signal with a frequency of 20 MHz by 10 times (10×). As known in the art, the general equation for the best case signal to noise ratio in a ΣΔ modulator is given by:

$$SNR = (N-1)\left(\frac{F_{clk}}{F_{signal}}\right)^{(K+\frac{1}{2})}$$

where N is the number of possible levels of feedback, K is the order of the loop, and the ratio of the clock frequency $F_{clk}$ to signal frequency $F_{signal}$ is the oversampling ratio.

Thus, with 10× oversampling, a conventional ΣΔ modulator with a first-order control loop and single feedback (i.e., two possible levels) will produce a SNR of about $10^{3/2}$ or about −30 dB, while a modulator with a second-order control loop and single feedback will produce a SNR of about $10^{5/2}$ or about −50 dB. (As will be appreciated by one of skill in the art, at 10× oversampling, the results will actually be less due to zeros in the loop to achieve stability.) The −80 dB at 20 MHz of curve 502 is approximately equivalent to what would be expected from a modulator using a fourth-order control loop ($10^{9/2}$), although only a second-order control loop is present. This is a result of the multiple feedback paths.

The illustrated embodiment also avoids the problems inherent in trying to build a higher order control loop, as such loops tend to become unstable. It is hard to build even a third-order control loop that remains stable at high frequencies, and building stable fourth-order and higher loops becomes even more difficult.

Similarly, simply trying to increase the frequency of operation of the control loop has problems. Instead of using the 200 MHz clock that oversamples a 20 MHz signal at 10×, one might try to use a 2 GHz clock and quantizer that oversamples the same signal at 100×. In theory, this greatly improves the SNR response of the control loop, but all of the components now need to run at 2 GHz and it becomes very difficult to make the elements of the loop accurate at such high speeds.

By contrast, as explained above, using 10 quantizers in a round-robin approach, one can still use the 200 MHz clock and simply offset the operation of each quantizer from the next by 500 pS to achieve roughly the same effect as multiplying the clock by 10. The circuit will appear to be quantizing the signal at a rate of 2 GHz.

However, even this approach has certain limitations. First, the output is not as accurate as the output would be of a circuit in which the components actually operate at 2 GHz. In a circuit truly operating at the higher 2 GHz speed, the output could change from a value of 1 to a value of −1 in 500 pS. In a circuit using 10 quantizers, the rate of change is limited since only one quantizer can change its output value at a time, while the outputs of the other 9 quantizers remain fixed until each operates in its turn.

Another issue is that one might think that if the circuit is quantizing at a rate of 2 GHz, it should be possible to oversample a 200 MHz signal at a rate of 10×. While a circuit in which all of the components actually operate at 2 GHz is capable of doing so, a circuit such as that described herein, in which the individual components actually operate at 200 MHz, will be unable to do so.

In spite of these limitations, the described embodiment provides substantial advantages in speed and precision over the traditional $\Sigma\Delta$ modulators of the prior art which have only a single quantizer, and is simpler than prior art solutions with higher order control loops. The described embodiment also has a cost advantage over prior art solutions that include DACs and ADCs in the $\Sigma\Delta$ modulator.

As noted with respect to FIGS. 4 and 5, in a $\Sigma\Delta$ modulator with a second-order control loop, there is a single point at which the SNR is at a maximum and the noise level approaches zero; it requires all three integrators to create this point. Traditionally, to create a response having two separate points of maximum SNR requires five integrators in a fourth-order control loop, which as above is very difficult to stabilize. To create a response with four points of minimal noise requires nine integrators in an eighth-order control loop, almost impossible to make successfully.

Figure 6:
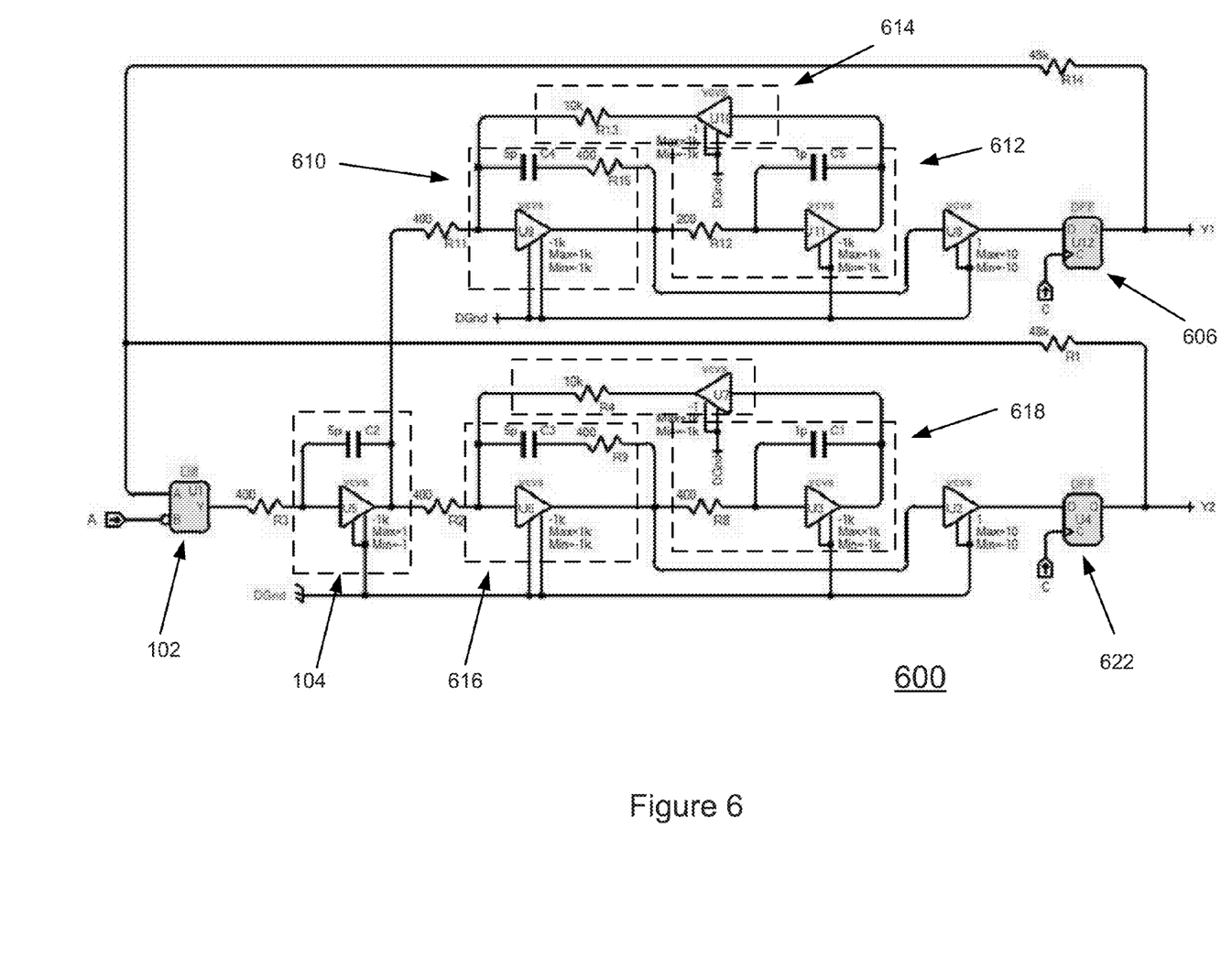
FIG. 6 is a block diagram of a $\Sigma\Delta$ modulator with two second-order control loops according to one embodiment.

An alternative approach is to have multiple separate control loops, each having a point of maximum SNR at a different frequency. FIG. 6 shows a circuit in which there are two control loops, which allows for two distinct points at which the SNR is maximized. Again, a comparator 102 receives both the input signal and the fed back output signals, and the resulting error signal is fed to a first integrator 104.

The signal from integrator 104 is then fed to both control loops. Each control loop has separate components. A first control loop has a typical second-order configuration with a second integrator 610, a third integrator 612 and a resonator feedback loop 614. The signals from the first integrator 104 and second integrator 610 are fed to a first quantizer 606, which produces one output signal Y1.

A second control loop likewise has a typical second-order configuration with additional integrators 616 and 618 functioning as the second and third integrators for the second control loop, and another resonator feedback loop 620. The signals from the first integrator 104 and integrator 616 are fed to a second quantizer 622, which produces a second output signal Y2. The outputs Y1 and Y2 are both fed back, and their sum input to comparator 102.

As will be familiar to one of skill in the art, changing the values of resistors R12 in the first control loop and R8 in the second control loop will change the frequency position of the points of maximum SNR, i.e., minimal noise, for each respective loop. Changing the values of resistor R13 in the first control loop and R4 in the second control loop will change both the position of the point of maximum SNR as well as the gain of the respective loops; the loops will otherwise produce substantially the same output. (As will be appreciated by one of skill in the art, while the effect of the resonator is small, and exponentially smaller the further it is from the resonance point, it does not go all the way to zero.)

This design thus achieves two points of maximum SNR, i.e., near zero noise, by using five integrators, as in the prior art. An advantage of this design is that this is accomplished with only two second-order control loops, rather than the much more difficult fourth-order control loop as has been previously done. If additional points of maximum SNR are desired, more control loops of the same configuration as shown may be added as well. However, the two control loops of FIG. 6 (and any added loops) operate at only the normal precision of a standard $\Sigma\Delta$ modulator with a second-order control loop of the prior art.

Figure 7:
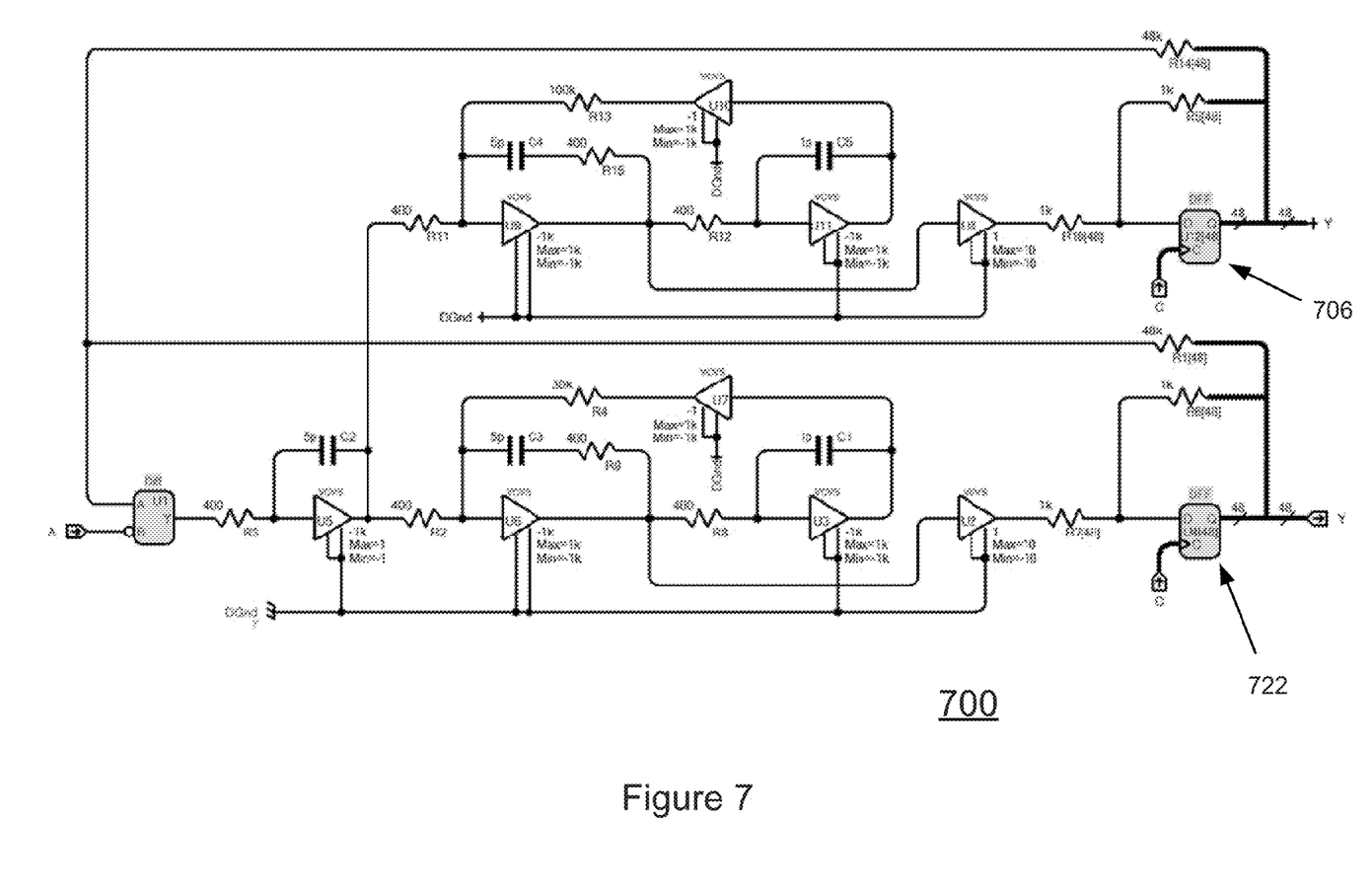
FIG. 7 is a block diagram of another $\Sigma\Delta$ modulator with two second-order control loop according to another embodiment.

It is possible to combine the feature of FIGS. 3 and 4 of multiple quantizers and feedback signals with the feature of the embodiment of FIG. 6 of multiple control loops. FIG. 7 shows a circuit which includes two control loops, and multiple quantizers in each control loop.

The elements are generally the same as those in FIG. 6. However, quantizer 606 is replaced by a plurality of quantizers 706 (here again 48), and quantizer 622 is similarly replaced by a plurality of quantizers 722. There are also multiple feedback lines and resisters, and, as in FIG. 4, resistors R5 and R10 in the first control loop and R6 and R7 in the second control loop to help separate noise from quantizers 706 and 722 respectively.

As in FIG. 6, changing the values of resistors R12 in the first control loop and R8 in the second control loop will change the position of the points of maximum SNR, while changing the values of resistor R13 in the first control loop and R4 in the second control loop will change both the position of the point of maximum SNR as well as the gain of the respective loops. Again, if more points of maximum SNR are desired, more loops may be added in a similar configuration.

By combining these features, it is possible to construct a $\Sigma\Delta$ modulator having both multiple points of maximum SNR at different frequencies and increased precision, and without having to operate at the increased frequency normally associated with such precision, without having to use more than a second-order control loop.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various types of clocks capable of generating clock signals of different phases are available, as are various devices suitable for use as quantizers. For example, a flip-flop may be used as a simple quantizer; a comparator will more accurately quantize the input level, but will typically still provide its output to a flip-flop to hold the output value for the appropriate time. Other choices will be apparent to those of skill in the art. Further, the illustration of 48 quantizers and the associated feedback lines, resistors, etc., is exemplary; one of skill in the art will be able to select the appropriate number of quantizers and related elements that is appropriate for a particular application.

These and other variations upon the embodiments are intended to be covered by the present disclosure, which is limited only by the appended claims.

What is claimed is:
1. An apparatus, comprising:
   a comparator configured to receive an input signal and a feedback signal, and to generate an error signal that is the difference between the input signal and the feedback signal;
   a first integrator for receiving and integrating the error signal;

a second integrator for receiving and further integrating the integrated error signal from the first integrator;

a clock for generating a plurality of clock signals of a single frequency, each clock signal out of phase with the next by a pre-determined interval;

a plurality of quantizers, each quantizer configured to receive the further integrated error signal from the second integrator and to generate a quantizer output upon receipt of a different one of the clock signals, such that successive quantizers receive clock signals in time-delayed succession at pre-determined intervals, and each quantizer is configured to operate at a rate of the interval between clock signals times the number of quantizers;

a summer for receiving and summing the plurality of quantizer outputs;

a feedback loop for receiving the summed quantizer outputs and providing them as the feedback signal to the comparator;

a third integrator for receiving and further integrating the integrated error signal from the second integrator; and a resonator feedback loop for receiving the further integrated error signal from the third integrator and providing it as an input signal to the second integrator.

2. The apparatus of claim 1 wherein the plurality of quantizers comprises a plurality of flip-flops.

3. The apparatus of claim 1 wherein each of the plurality of quantizers comprises a comparator and a flip-flop.

4. The apparatus of claim 1 wherein the first integrator is a switched capacitor integrator.

5. The apparatus of claim 1 wherein the second integrator is a switched capacitor integrator.

6. The apparatus of claim 1 wherein the third integrator is a switched capacitor integrator.

7. An apparatus, comprising:

a comparator configured to receive an input signal and a feedback signal, and to generate an error signal that is the difference between the input signal and the feedback signal;

a first integrator for receiving and integrating the error signal;

a second integrator for receiving and further integrating the integrated error signal from the first integrator;

a first quantizer configured to receive the further integrated error signal from the second integrator and to generate as first quantizer output upon receipt of a clock signal;

a third integrator for receiving and further integrating the integrated error signal from the second integrator;

a first resonator feedback loop for receiving the further integrated error signal from the third integrator and providing it as an input signal to the second integrator;

a third integrator for further integrating the integrated error signal from the first integrator;

a second quantizer configured to receive the further integrated error signal from the third integrator and to generate as second quantizer output upon receipt of a clock signal;

a fourth integrator for receiving and further integrating the integrated error signal from the third integrator;

a second resonator feedback loop for receiving the further integrated error signal from the fourth integrator and providing it as an input signal to the third integrator;

a clock for generating a clock signal to the first and second quantizers;

a summer for receiving and summing the outputs of the first and second quantizers; and a feedback loop for receiving the summed quantizer outputs and providing the sum as the feedback signal to the comparator.

8. The apparatus of claim 7 wherein the first quantizer comprises a flip-flop.

9. The apparatus of claim 7 wherein the first quantizer comprises a comparator and a flip-flop.

10. The apparatus at claim 7 wherein the second quantizer comprises a flip-flop.

11. The apparatus of claim 7 wherein the second quantizer comprises a comparator and a flip-flop.

12. An apparatus, comprising:

a comparator configured to receive an input signal and a feedback signal, and to generate an error signal that is the difference between the input signal and the feedback signal;

a plurality of signal processing blocks for receiving and processing the error signal, each signal processing block having a defined frequency response which is independent of the frequency responses of the other signal processing blocks;

a clock for generating a plurality of clock signals of a single frequency, each clock signal out of phase with the next by a pre-determined interval;

a plurality of quantizers, each quantizer configured to receive the processed error signal from a different one of the plurality of signal processing blocks and to generate a quantizer output upon receipt of a different one of the clock signals, such that successive quantizers receive clock signals in time-delayed succession at pre-determined intervals, and each quantizer is configured to operate at a rate of the interval between clock signals times the number of quantizers;

a summer for receiving and summing the plurality of quantizer outputs; and a feedback loop for receiving the summed quantizer outputs and providing them as the feedback signal to the comparator.

* * * * *